United States Patent [19]
Elman et al.

[11] Patent Number: 5,175,740
[45] Date of Patent: Dec. 29, 1992

[54] SEMICONDUCTOR LASER AND METHOD OF FABRICATING SAME

[75] Inventors: Boris S. Elman, Newton; Wayne F. Sharfin, Lexington, both of Mass.

[73] Assignee: GTE Laboratories Incorporated, Waltham, Mass.

[21] Appl. No.: 734,827

[22] Filed: Jul. 24, 1991

[51] Int. Cl.$^5$ .................... H01S 3/19; H01L 21/20
[52] U.S. Cl. .................... 372/45; 372/43; 372/50; 437/51; 437/129
[58] Field of Search .......... 372/43, 44, 45, 50; 357/29, 30, 16, 17, 19, 30; 437/51, 22, 23, 36, 80, 81, 126, 129; 385/14, 131, 132

[56] References Cited

U.S. PATENT DOCUMENTS

| | | | |
|---|---|---|---|
| 4,962,057 | 10/1990 | Epler et al. | 437/81 |
| 5,020,153 | 5/1991 | Choa et al. | 372/96 |
| 5,111,470 | 5/1992 | Hosoba et al. | 372/46 |
| 5,114,877 | 5/1992 | Paoli et al. | 437/129 |
| 5,124,996 | 6/1992 | Ikeda | 372/45 |
| 5,126,803 | 6/1992 | Hager et al. | 372/45 X |
| 5,126,804 | 6/1992 | Nagai et al. | 372/45 X |

OTHER PUBLICATIONS

M. Okayasu et al., "High-Power 0.98 ... Amplifier," Electronic Letters, Nov. 11, 1989, vol. 25, No. 23, pp. 1563-1565.

M. Okayasu et al., "Stable Operation (Over 5000 h) ... Amplifiers," IEEE Photonics Technology Letters, Oct. 1990, vol. 2, No. 10, pp. 689-691.

M. Yamada et al., "Noise Characteristics of $Er^{3+}$ ... Diodes," IEEE Photonics Technology Letters, Mar. 1990, vol. 2, No. 3, pp. 305-307.

M. Shimizu et al., "Erbium-Doped Fibre Amplifiers ... 11.0 dB/mW," Electronics Letters, Sep. 27, 1990, vol. 26, No. 20, pp. 1641-1643.

C. Shieh et al., "Anomalous dependence of threshold current ... lasers," Appl. Phys. Lett., Jun. 1989, vol. 54, No. 25, pp. 2521-2523.

*Primary Examiner*—Brian Healy
*Attorney, Agent, or Firm*—Victor F. Lohmann, III

[57] ABSTRACT

A ridge-waveguide laser is fabricated by epitaxially growing a GaAs-based heterostructure, disposing an AlAs etch stop layer on the heterostructure, disposing epitaxial layers on the etch stop layer, and etching the heterostructure to form the laser whereby the etch stop layer prevents further etching into said heterostructure.

5 Claims, 4 Drawing Sheets

SEMICONDUCTOR LASER AND METHOD OF FABRICATING SAME

FIELD OF THE INVENTION

This invention relates to semiconductor processing and, more particularly, to a method of fabricating GaAs-based lasers with etch-stop layers.

BACKGROUND OF THE INVENTION

Semiconductor lasers with a high degree of spatial mode stability at high output power are of great importance for optical fiber systems applications. In particular, single-mode 980 nm semiconductor lasers are preferred pump sources for $Er^{3+}$ doped silica fiber amplifiers as indicated by Okayasu et al. in Electronics Letters, Vol. 25, p. 1564 (1989) and Okayasu et al. in Photonics Technology Letters, Vol. 2, p. 689 (1990). The pump band at 980 nm is most efficient of the principle $Er^{3+}$ absorption bands in terms of gain per input optical power. Pumping at 980 nm is also preferred in comparison to pumping at 1480 nm because less noise is introduced into the amplified optical signal.

In principle, the simplest way to achieve high power fundamental mode performance is to process the lasers as ridge waveguide structures. In practice, stringent dimensional tolerances are required to achieve good performance in these weakly-index-guided structures.

In such structures the geometry of the laser's lateral waveguide has to be carefully controlled to ensure that all of the power is in the fundamental spatial mode. A critical step in the fabrication of ridge waveguide lasers is control of the etch depth, which determines the lateral mode confinement.

If the ridge is not etched deeply enough, the laser is essentially gain-guided, and the high degree of anti-guiding from carrier-induced changes in refractive index in this system increases threshold current densities by more than an order of magnitude as reported by Shieh et al. in Appl. Phys. Letters, Vol. 54, p. 2521 (1989). If the ridge is etched too deeply, however, the laser will support multiple lateral (spatial) modes. Optimum performance requires that the distance from the bottom of the ridge to the active layer be controlled to better than 50 nm which, for these lasers, is typically less than 3% of the entire etch depth as shown by Crawford et al. in "Optical Amplifiers and Their Applications," paper WC4, Second Topical Meeting, Snowmass Village, Colo. (1991).

InP-based ridge waveguide lasers have been made using selective wet etchants and quaternary InGaAsP etch-stop layers. In contrast, GaAs-based ridge waveguide lasers have been made using timed etching because of the absence of a suitable etch-stop process. Crawford et al., supra, have previously reported InGaAs/GaAs Fabry-Perot lasers exhibiting single frequency operation to output powers as high as 170 mW. Those lasers, however, were fabricated by a technique that required tedious monitoring of the etch depth and exhibited non-uniform etch depth across the wafer.

In view of the poor control and reproducibility of the etch depth in fabricating GaAs-based heterostructures, the conventional technique of timed etching with no etch-stop layers is not a suitable procedure for producing GaAs-based ridge waveguide devices.

OBJECTS OF THE INVENTION

It is a primary object of the present invention to obviate the above-noted and disadvantages of the prior art.

It is a further object of the present invention to incorporate an AlAs etch-stop layer into a heterostructure to facilitate the fabrication of a mesa ridge device.

SUMMARY OF THE INVENTION

The present invention is directed to a method of fabricating a mesa structure including a ridge - waveguide laser, comprising the steps of epitaxially growing a heterostructure, disposing an etch stop layer on heterostructure, disposing epitaxial layers on said AlAs etch stop layer, and etching said heterostructure to form said mesa structure whereby said etch stop layer prevents further etching into said epitaxial layers.

IN THE DRAWINGS

DETAILED DESCRIPTION OF THE PREFERRED EMBODIMENTS

The present invention is directed to a method of fabricating a GaAs-based mesa structure using an AlAs etch stop layer to facilitate control of the mesa height. Preferably, the mesa is a ridge-waveguide laser structure.

Figure 1:
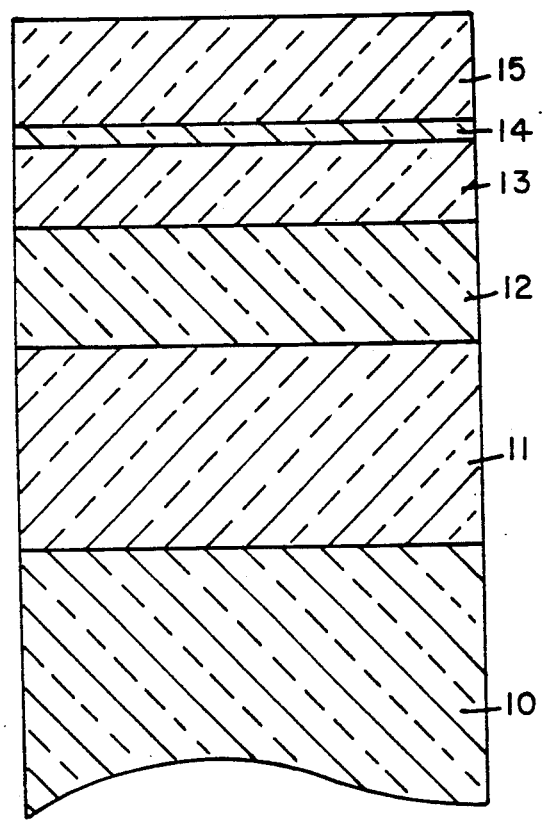
FIG. 1 is a lateral cross-sectional view of a heterostructure for illustrating the method of the present invention.

FIG. 1 shows a lateral cross-section of an exemplary heterostructure for illustrating the principles of the present invention. The structure includes a substrate 10, a first cladding layer 11, an active region 12, and a second cladding layer with regions 13 and 15 having an etch stop layer 14 interposed therebetween. One such exemplary heterostructure is a GaAs-based heterostructure having an $Al_xGa_{1-x}As/GaAs/Al_yGa_{1-y}As$ structure wherein the GaAs layer 12 is the optical waveguiding region (active region of the laser) and the AlGaAs layers 11, 13, and 15 are the cladding layers. As is well known to those skilled in the art, the heterostructure may include other epitaxially-grown layers than those described above.

As indicated above, a critical processing step for fabricating a mesa structure involves etching the ridge to the proper depth. In conventional wafer fabrication process, there is a lack of control in etching the entire wafer region to a uniform depth. However, the etch stop layer of the present invention permits non-uniform etching rates across the wafer surface since the etching process in each mesa structure will practically stop once the AlAs etch stop layer is reached.

In accordance with the present invention, the advantage of using AlAs as an etch stop layer is made available by selecting the appropriate etchant so that the etchant will react more rapidly with the epitaxial layers above the AlAs than with the AlAs layer. Accordingly, the ratio of the respective etching rates for the AlAs and the epitaxial layers above the AlAs is an important fabrication parameter. Depending upon the material system which is grown above the AlAs, the pH of the etchant must be adjusted to maintain a much slower etching rate for the AlAs etch stop layer.

The following discussion details a structure fabricated in accordance with the present invention to enable those skilled in the art to more clearly understand and practice the present invention. These structures should not be considered as a limitation upon the scope of the present invention, but merely as being illustrative and representative thereof. Similarity of reference numerals among the Figures reflects identical structures, regions, or heterolayers.

Figure 2:
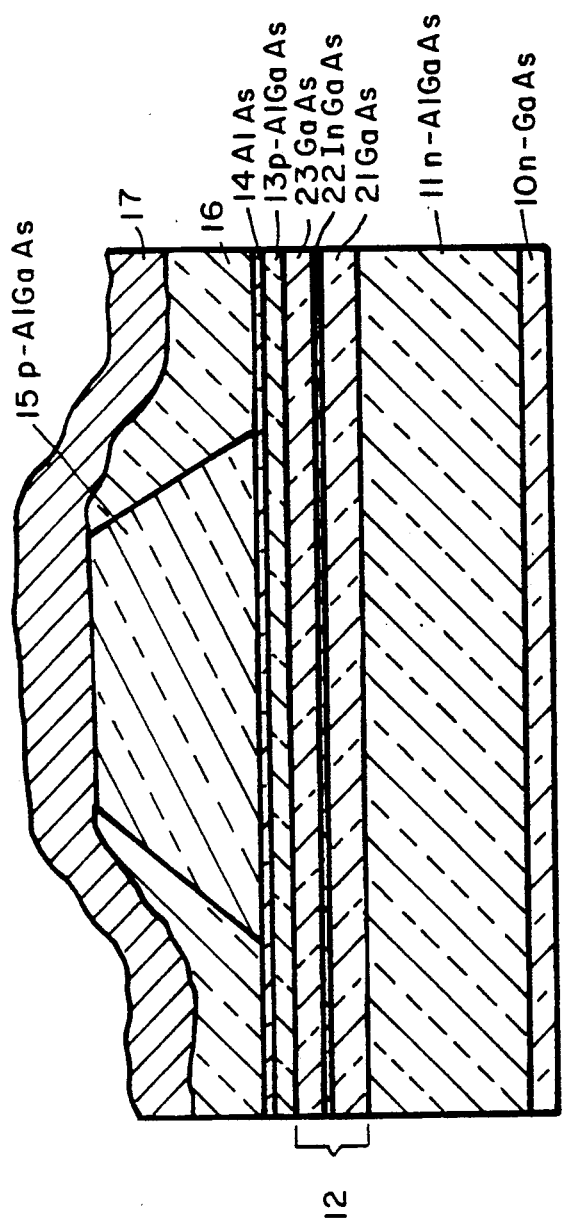
FIG. 2 is a schematic representation of a photographic cross-section of a laser mesa structure fabricated in accordance with the present invention.

A structure fabricated in accordance with the present invention is illustrated in FIG. 2. An active layer 12, which includes a single quantum well 22 of InGaAs with nominal thickness of 10 nm and a nominal InAs composition of 20%, is sandwiched between two 200 nm-thick undoped GaAs guide layers 21 and 23. This separate confinement quantum well region is centered between ~1 μm thick n-type layer 11 and p-type layer 15 of $Al_{0.22}Ga_{0.78}As$.

The epitaxial layers in the structure of FIG. 2 are grown by molecular beam epitaxy (MBE), with the InGaAs quantum well 22 grown at a substrate temperature of 530° C., the GaAs layers grown at 600° C., and the AlGaAs layers grown at 650° C. AlAs layer 14 (thickness of ~3 nm) is used as an etch-stop layer and is integrated between p-$Al_{0.22}Ga_{0.78}As$ layers in the above-mentioned structure at a given distance d (depth of region 13) from the active region during the epitaxial growth of the heterostructure.

The precise value of d is a function of epilayer composition and is first estimated by a waveguide analysis, and is ultimately determined by empirical methods. For the structure shown in FIG. 2, the region 13 is a 130 nm-thick layer of p-AlGaAs. Be-doped p+ GaAs and InGaAs layers serve as the (~100 nm) p-contact layer on p-type layer 15.

Selective wet chemical etching of the as-grown heterostructure of FIG. 2 is performed using a succinic acid solution. The etchant is made by first combining 200 g of pure succinic acid with a liter of water, using ammonium hydroxide to dissolve the acid and adjust the pH. Then, fifteen (15) parts of the succinic acid solution with ammonia is combined with one (1) part of hydrogen peroxide (30%$H_2O_2$). In order for this solution to selectively etch $Al_{0.22}Ga_{0.78}As$ versus AlAs, the pH has to be adjusted to about 5. Under these conditions, the ratio of the respective etch rates was determined to be greater than $10^2$. The ridge is isolated from the rest of the chip by the use of a dielectric layer 16 formed from sputtered $SiO_2$. A p-type contact 17 and n-type contact contacts are formed using TiPtAu and alloyed AuSn with TiAu, respectively.

It should be obvious to those skilled in the art that structures other than those described above can be fabricated in accordance with the present invention. For example, the active region may include an arbitrary waveguiding region such as $Al_zGa_{1-z}As$ (z<x,y), or a GaAs/$Al_zGa_{1-z}As$ quantum well structure. Furthermore, fabrication processes other than MBE are available to epitaxially grow the heterostructure, with it being apparent to those skilled in the art that other suitable etchants may be chosen which are appropriate for the given material system being used.

Figure 3:
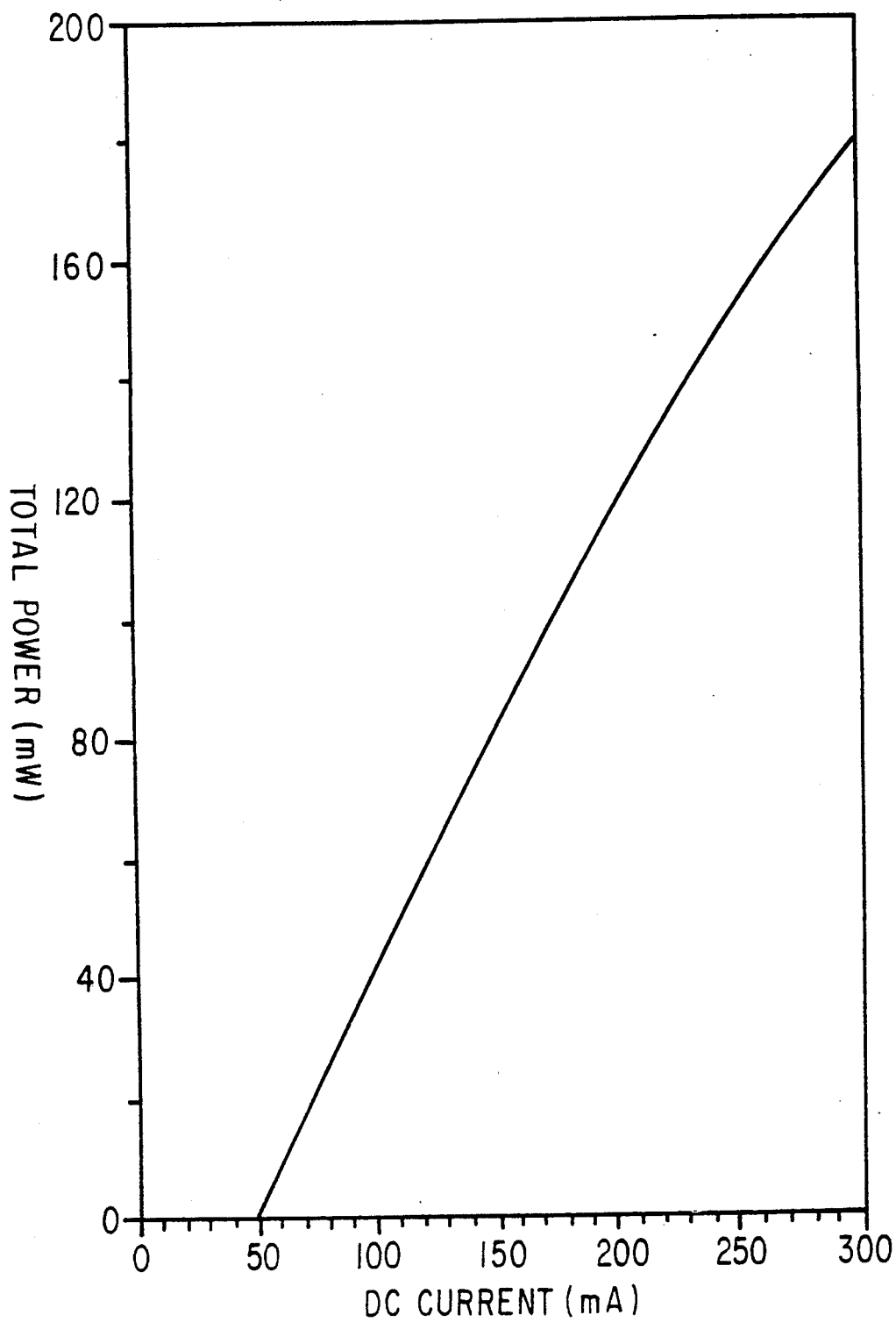
FIG. 3 is a graph illustrating the power-current relationship for the laser of FIG. 2.

Measurements were obtained from an uncoated 1000 μm-long laser having the epitaxial structure of FIG. 2 to derive the cw power-current curve of FIG. 3. As indicated in FIG. 3, output power as high as 180 mW is obtainable. Threshold currents are typically 50 mA, with a total differential quantum efficiency of 62%, a characteristic temperature $T_o$ of about 80° K., and a series resistance of 2Ω.

Figure 4:
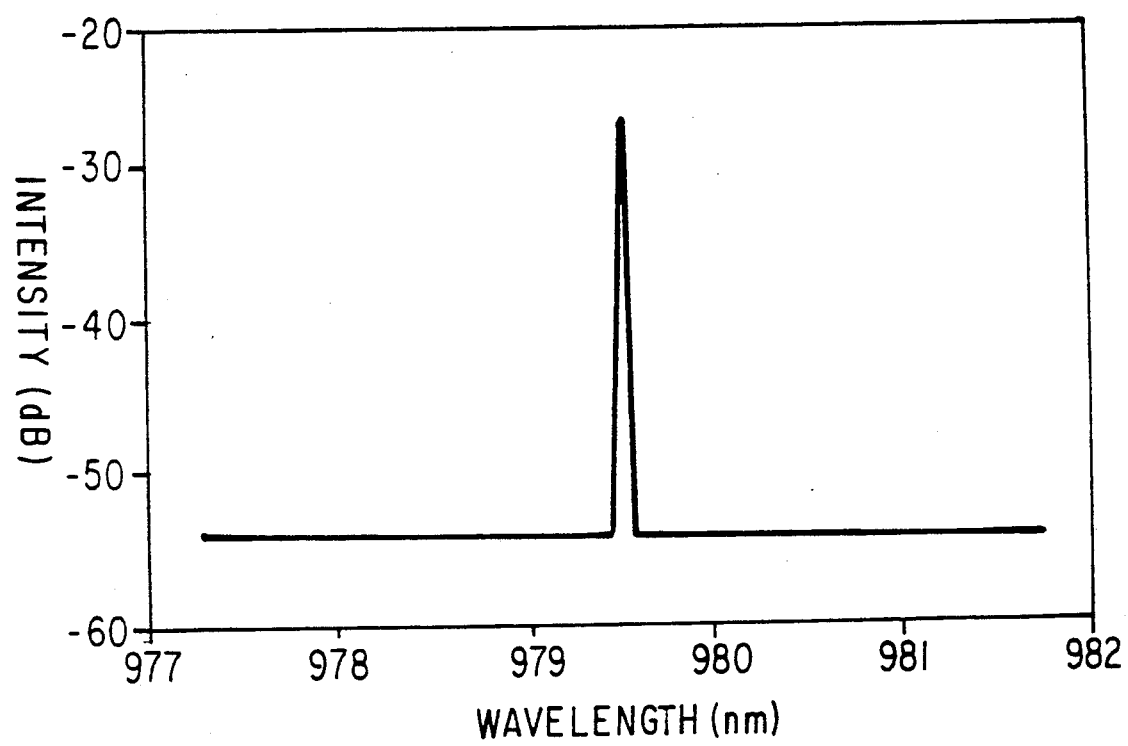
FIG. 4 illustrates the spectral characteristics of the laser of FIG. 2.

Lasers such as that in FIG. 2 typically operate in a single spatial mode up to the highest powers measured. A sensitive measure of the mode quality can be obtained by monitoring the emission spectrum, which consistently shows single-frequency operation even at very high power levels. The spectral output of the laser in FIG. 2 was monitored using an optical spectrum analyzer. The trace shown in FIG. 4 indicates a total output power of 120 mW, with the device emitting a single frequency centered at 979.5 nm having a sidemode suppression ratio greater than 25 dB.

What has been shown and described herein is the design, fabrication, and characteristics of a mesa heterostructure, preferably a GaAs-based ridge waveguide laser, having an AlAs etch-stop layer. The etch-stop layer permits reproducible and uniform wafer fabrication which could lead to inexpensive, high-throughput batch processing of GaAs-based ridge waveguide devices without the need for expensive wafer-spinning equipment to ensure the etch depth uniformity that is essential for high process yield. The lasers fabricated by this procedure have high output powers (180 mW), and operate in the fundamental spatial mode with single frequency emission spectra. As a result of the present invention, laser structures can be etched to a known depth defined by the distance from the active region to the AlAs etch stop layer.

Advantages of this way of fabricating ridge waveguiding GaAs-based devices compared with timed etch procedure are obvious precise control of layer thickness d (thickness control in modern epitaxial growth techniques is of the order of 1 monolayer) resulting in reproducible and uniform formation of a ridge structure associated with preferential nature of the etchant.

While there has been shown and described what are at present considered the preferred embodiments of the invention, it will be obvious to those skilled in the art that various changes and modifications can be made therein without departing from the scope of the invention as defined by the appended claims.

What is claimed is:

1. A method of fabricating a mesa structure including a ridge-waveguide laser, comprising the steps of:
   epitaxially growing a heterostructure;
   disposing an AlAs etch stop layer on said heterostructure;
   disposing epitaxial layers on said etch stop layer; and
   etching said epitaxial layers to form said mesa structure whereby said etch stop layer prevents further etching into said heterostructure.

2. The method as recited in claim 1 wherein said laser includes:
   a GaAs substrate;
   an AlGaAs lower cladding layer;
   a GaAs/InGaAs/GaAs quantum well active region;
   a first AlGaAs upper cladding layer interposed between said active region and said etch stop layer; and
   a second AlGaAs upper cladding layer disposed on said etch stop layer.

3. A heterostructure for fabricating a laser, comprising:
   an epitaxially-grown heterostructure;

an AlAs etch stop layer disposed on said epitaxially-grown heterostructure; and epitaxial layers disposed on said etch stop layer.

4. The heterostructure as recited in claim 3 wherein said epitaxially-grown heterostructure includes:

a GaAs substrate;

an AlGaAs lower cladding layer disposed on said substrate;

a GaAs/InGaAs/GaAs quantum well active region disposed on said lower cladding layer; and an AlGaAs upper cladding layer disposed on said active region.

5. The heterostructure as recited in claim 4 wherein said epitaxial layers are AlGaAs.

* * * * *